United States Patent [19]

Patterson

[11] 3,943,168
[45] Mar. 9, 1976

[54] CONDUCTOR COMPOSITIONS COMPRISING NICKEL BORIDES

[75] Inventor: Frank Knowles Patterson, Wilmington, Del.

[73] Assignee: E. I. Du Pont de Nemours and Company, Wilmington, Del.

[22] Filed: Nov. 13, 1974

[21] Appl. No.: 523,473

[52] U.S. Cl. .............................. 252/519; 252/518
[51] Int. Cl.² ...................... H01B 1/06; H01C 1/06
[58] Field of Search ............ 252/519, 518; 313/218; 428/426, 427, 428

[56] References Cited
UNITED STATES PATENTS 3,503,801   3/1970   Huang et al. ..................... 428/427
3,794,518   2/1974   Howell ............................. 428/428

Primary Examiner—Benjamin R. Padgett
Assistant Examiner—Josephine Lloyd

[57] ABSTRACT

Disclosed herein are powder compositions useful for making conductors, e.g., microcircuit conductors, end terminations for capacitors, electrodes for gas discharge display devices, etc. The compositions comprise inorganic powders dispersed in an inert vehicle and are printed and fired in the conventional manner on dielectric substrates. The inorganic powders comprise certain nickel compounds (borides or boride-silicides). Glass powder, nickel metal powder, and/or nickel silicide may also be present.

17 Claims, No Drawings

CONDUCTOR COMPOSITIONS COMPRISING NICKEL BORIDES

BACKGROUND OF THE INVENTION

This invention relates to electronics, and more particularly to compositions useful for producing conductor patterns adherent to substrates.

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the printed film, the metallic component of the composition provides the functional (conductive) utility, while the inorganic binder (e.g., glass, $Bi_2O_3$, etc.) bonds the metal particles to one another and to the substrate. Thick film techniques ae contrasted with thin film techniques which involve deposition of particles by evaporation or sputtering. Thick film techniques are generally discussed in "Handbook of Materials and Processes for Electronics, " C. A. Harper, Editor, McGraw-Hill, N.Y., 1970, Chapter 12.

The most commonly used conductor compositions employ noble metals, especially gold, silver, platinum, palladium, and their mixtures, alloys, and compounds, since their relatively inert characteristics permit firing in air. Attempts at using dispersions of less expensive non-noble metals have often been confined to specialized uses or have required the great practical inconvenience and expense of firing in non-oxidizing atmospheres (nitrogen, nitrogen/hydrogen, hydrogen, argon, etc.).

There is a distinct commercial need for less expensive conductor compositions which can be fired in air to produce adherent low resistivity conductors on dielectric substrates, including microcircuit patterns, end terminations for resistors, etc.

Present commercial practice in the manufacture of gas discharge display devices is to fire nickel powders in a reducing or inert (non-oxidizing) atmosphere at high temperatures (e.g., above 900°C.) on relatively expensive forsterite ($2MgO.SiO_2$) substrates. Nickel is used due to its low tendency to sputter under glow discharge. The use of inexpensive, mass-produced, high quality glass substrates such as soda lime glass substrates would be desirable. However, the use of soda lime glass substrates limits the firing temperature of conductors thereon to no more than 600°C., due to the low softening point of the glass. At these low temperatures it is very difficult to obtain good metallic sintering of nickel; consequently, adherent low resistivity nickel conductors are difficult to make.

There is consequently the need for a nickel-based conductor which can be fired below 600°C. in making gas discharge display devices on soda lime glass substrates. It is further desirable that the compositions be fireable in air, rather than in more expensive atmospheres (inert or reducing atmospheres).

Huang et al. U.S. Pat. No. 3,503,801, issued Mar. 31, 1970, discloses the use of metal borides and glass in the manufacture of resistors. The borides include those of chromium, zirconium, molybdenum, tantalum, and titanium. Neither conductors nor nickel borides are suggested. Numerous patents disclose the deposition of coatings of nickel and boron (not nickel boride) on substrates from a plating bath of materials such as amine boranes (see U.S. Pat. No. 3,045,334, issued July 24, 1962, and U.S. Pat. No. 3,338,726, issued Aug. 29, 1967, each to Berzins), and three patents to Bellis, U.S. Pat. No. 3,672,964, issued June 27, 1972, U.S. Pat. No. 3,674,447, issued July 4, 1972, and U.S. Pat. No. 3,738,849, issued June 12, 1973. These patents do not relate to dispersions of borides which may be printed (and fired) on substrates, but rather to plating Ni/B coatings on the entire surface exposed to such a bath.

Metal borides and silicides have been reported to be inert to oxidation at room temperature. At elevated temperature, borides are oxidized, although rates of oxidation vary, Greenwood et al., Quarterly Reviews (London) 20, page 441, 1966. German Patent Publication OS 2,222,695, published Nov. 22, 1973, discloses base metal resistor compositions of boron, molybdenum, or tungsten silicides plus molybdenum or tungsten glasses. Howell U.S. Pat. No. 3,794,518, issued Feb. 26, 1974, discloses resistors also, of glass plus certain copper nickel alloys, which were fired in an inert atmosphere (column 3, line 74) to resistors which fuse (open) when subjected to overload.

Representative of art on gas discharge display devices are the following patents, each of which is hereby incorporated by reference herein. McCauley U.S. Pat. No. 2,991,387 (issued July 4, 1961) discloses tube-type display devices. Bentley U.S. Pat. No. 2,933,648 (issued Apr. 19, 1960) discloses flat display devices employing a multiplicity of display cavities. Ogle U.S. Pat. No. 3,558,975 (issued Jan. 26, 1971) discloses glass display devices using electrodes of gold or the like. Milgram U.S. Pat. No. 3,788,722 (issued Jan. 29, 1974) discloses process for manufacturing flat display devices from ceramic tape and precious metal pastes; FIG. 4 is a top view of a line bar gas display device. Recent non-tube display devices include the Burroughs Panaplex II panel display, described in Burroughs Bulletin No. 1179A dated March, 1974; these are a family of common envelope, multidigit display devices. Nickel-based electrodes fireable in air would be especially useful for the displays of types represented by the above patents and bulletin.

SUMMARY OF THE INVENTION

This invention provides nickel-based compositions used for producing conductor patterns on dielectric substrates. The compositions may, but need not be, fired in air. Moreover, they may be fired even at temperatures compatible with the use of inexpensive soda lime glass substrates. The compositions nonetheless can produce conductor patterns having useful resistivities and adhesion.

The compositions of this invention are finely divided inorganic powders dispersed in a liquid vehicle. The inorganic powder comprises one or more compounds of nickel, wherein the compounds of nickel have the overall approximate composition

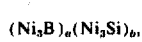

wherein the sum of $a$ plus $b$ equals one, $a$ is in the range ⅓ to 1, and $b$ is in the range 0 to ⅔, of course on a molar basis. By this compositional formula it is not implied that only chemical compounds are involved, as discussed more fully below. The compositional formula is meant to indicate an $Ni_3B/Ni_3Si$ ratio where such borides and silicides are present in any of the chemical forms discussed herein. In these compositions the nickel compounds are one or more of $Ni_3B$; solid solutions of the formula

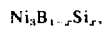

$Ni_3B_{1-x}Si_x$, wherein $x$ is in the approximate range up to 0.1; mixtures of either $Ni_3B$ or $Ni_3B_{1-x}Si_x$ solid solutions with $Ni_3Si$; or mixtures of $Ni_3B$ and $Ni_3Si$. In any such nickel compound or combination of nickel compounds, the total amount of B and Si is such that the atomic ratio B/Si is no less than ½, that is, there are up to but no more than 2 Si atoms per B atom in the nickel compounds. Restated, the amount of Si present in the total of such nickel compounds present is no more than two times the amount of B present, on an atomic basis. Amounts of silicon in excess of that level tend to increase resistivity to unacceptable levels.

The compositions of the present invention, in addition to such nickel compounds, normally comprise conventional inorganic binder, such as glass, $Bi_2O_3$, etc., well known to those skilled in the art. On an inorganic solids basis, the amount of such nickel compounds in these compositions is 30–100%, preferably 50–98%, more preferably 70–96%.

These compositions may additionally comprise nickel metal powder. The amount of nickel powder is somewhat dependent upon the firing temperature used, but is up to 80% of the total weight of the nickel and nickel compounds present. At lower firing temperatures the amount of nickel metal powder present can conveniently be at the upper end of this range (near 80% of total nickel metal and nickel compounds). Where unencapsulated conductors are to be exposed to high humidity for long periods, preferred compositions of the invention comprise mixtures of $Ni_3B$ and Ni metal.

The present invention also is the composition of the present invention fired (sintered) on and adherent to a dielectric substrate, such as glass, glass-ceramic, and ceramic substrates. The present invention also involves improved gas discharge display devices. Such devices comprise two dielectric substrates having conductor patterns printed on one or both thereof in operative fashion. The substrates are assembled such that a dielectric spacer separates them and defines a cavity or gap between the substrates. The device is, of course, provided with means for holding the two substrates and separator together, e.g., clamps, adhesive, etc. The cavity is filled with an ionizable light-producing gas of the type well known to those skilled in the art (including argon, neon, or the like, separately or in mixtures). In the use of such devices an electric current is applied as desired to various electrode segments, causing ionization and production of light. The improvement in the devices of the present invention lies in the use of electrodes of the sintered or fired compositions of the present invention, that is, the electrodes are produced by printing on the substrate a dispersion of one or more nickel compounds having an overall approximate composition of

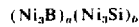

$(Ni_3B)_a(Ni_3Si)_b$ wherein the sum of $a$ plus $b$ is one, $a$ is in the range ⅓ to 1, and $b$ is in the range 0 to ⅔. As indicated above, various other inorganic powders are optional in those compositions. A preferred substrate is glass, especially soda lime glass.

DETAILED DESCRIPTION OF THE INVENTION

The essential components of the compositions of the present invention are the nickel compounds described above, which include $Ni_3B$ as their simplest member. During firing of these nickel compounds in air, at least some of the nickel becomes nickel metal, encapuslated by $B_2O_3$; where silicon is present in the nickel compounds as a solid solution $Ni_3B_{1-x}Si_x$, where $x$ is up to 0.1, such nickel metal will be encapsulated by $B_2O_3/SiO_2$. Such systems initially fired in air can, therefore, be refired in air without substantial oxidation and consequent degradation of electrical properties (e.g., increased resistivity). This ability to withstand refiring is quite useful in the assembly of a gas discharge display device since multiple firing steps may be involved (e.g., nickel conductor, dielectric insulating layer, nickel cathode, and contrasting dielectric).

The compositions of the present invention will normally be fired at temperatures in the range 550°–1025°C., preferably 570°–950°C.; although air firing is most convenient, they may also be fired in inert or reducing atmospheres. Normally the time of firing is at least 2 minutes, preferably about 10 minutes, at peak temperature.

Where gas discharge display devices are made on soda lime glass substrates, firing temperatures in the 550°–600°C. range will be used, preferably 550°–570°C.

The $Ni_3B_{1-x}Si_x$ solid solutions of the present invention, and mixtures thereof with $Ni_3Si$, can be made by heating the elements or $Ni_3B$ and $Ni_3Si$ in the desired proportions to form a liquid, and then solidifying the mass. It is preferred that heating be carried out by induction or arc melting techniques in vacuum or inert atmospheres, followed by annealing in vacuum at about 950°C.

Any conventional electronic glass powder may be used as the inorganic binder in the compositions of the present invention, as known to those skilled in the art, including, for example, those of Larson and Short U.S. Pat. No. 2,822,279 (issued Feb. 4, 1958); Short U.S. Pat. No. 2,819,170 (issued Jan. 7, 1958); etc.

All the inorganic powders used herein are finely divided, i.e., pass through a 400-mesh screen. It is preferred that substantially all the particles have a largest dimension ("diameter") of 5 microns or less.

The inorganic particles are mixed with an inert liquid vehicle by mechanical mixing (e.g., on a roll mill) to form a paste-like composition. The latter is printed as "thick film" on conventional dielectric substrates in the conventional manner. Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to solids in the dispersions may vary considerably and depends upon the manner in which the dispersion is to be applied and the kind of vehicle used. Normally to achieve good coverage the dispersions will contain 60–80% solids and 20–40% vehicle. The compositions of the present invention may, of course, be modified by the addition of other materials which do not affect its beneficial characteristics.

After drying to remove the vehicle, firing of the compositions of the present invention is carried out at temperatures and for times sufficient to sinter the inorganic materials and to produce conductor patterns adherent to the dielectric substrate, as discussed above.

The advance involved in the gas discharge display devices of the present invention is in the use of compositions comprising the nickel compounds of the present invention as some or all of the electrodes. The geometry of the display device is not of the essence of the present invention. Any appropriate geometry may be used in manufacturing the display device. The display device will comprise dielectric substrates having a cavity therebetween. The cavity is provided by a spacer between the substrates. The substrates and spacer are clamped or adhesively connected together. The substrates have electrodes of the present invention fired (sintered) thereon, the compositions of the present invention having been deposited (e.g., printed) thereon in the desired pattern, followed by heating to produce physically and electrically continuous conductors. The device may include printed dielectric layers, as well known in the art. The device will include means for evacuating the cavity and then filling with the appropriate excitable gas. The electrodes are, of course, operatively connected electrically with the desired electrical circuits.

EXAMPLES

The following examples are presented to illustrate the invention. In the examples and elsewhere in the specification and claims, all parts, percentages, ratios, etc., are by weight unless otherwise stated; the relationship between $a$ and $b$ in the formula $(Ni_3B)_a(Ni_3Si)_b$ is on a molar basis and the ratio between Si and B in the nickel compounds of this invention is sometimes expressed on an atomic basis. All mesh sizes are U.S. standard sieve scale.

PREPARATION OF NICKEL COMPOUNDS $Ni_3B$ (99% pure) was reduced in size to a powder having a surface area of about 3.7 m.$^2$/g. An average particle size of 0.2 micron was calculated, assuming spherical particles, from the formula particle size (microns) = $(6/(m.^2/g.)(d))$ where $d$ is density in g./cc. The powder was washed at room temperature with a ⅓ (by volume) solution of concentrated aqueous HCl and water.

$Ni_3Si$ was prepared from the elements by arc melting under argon followed by annealing in vacuum at 950°C. It was reduced in size to minus 400 mesh.

Solid solutions of the formula $Ni_3B_{1-x}Si_x$ were prepared by mixing the elements in the desired proportions, then arc melting the mixture under dry argon on a water-cooled copper hearth. A thoriated tungsten electrode was used.

In addition to such solid solutions, wherein $x$ does not exceed 0.10, also prepared by the same arc melting technique were mixtures of $Ni_3Si$ and $Ni_3B_{1-x}Si_x$ (it was observed that such mixtures are miscible in the liquid state). After solidification the mixtures were pulverized and screened to minus 400 mesh.

PREPARATION OF TEST SPECIMENS

The nickel compound powders prepared as described above were dispersed with various finely divided (minus 400 mesh) glass powders in a vehicle of 9 parts terpineol and 1 part ethyl cellulose. The dispersions were printed through a patterned 200-mesh screen on a substrate (either dense, 96% alumina or soda lime glass) as a 200 square serpentine pattern. The prints were dried at 100°C. for 10 minutes to a dried thickness of about 20–25 microns, and then fired in air in a muffle furnace or in a tube furnace within a quartz tube under various atmospheres, at the respective temperatures indicated below, fired film thickness was about 15 microns.

Resistivity (in ohms/square) was determined on Simpson Electric Co. Model 460 Direct Volt/Ohmmeter on fired films.

EXAMPLES 1–10

$Ni_3B$/glass mixtures were found to produce useful conductors upon being fired in air on soda lime glass substrates. In these examples mixtures of $Ni_3B$ and a glass (68.6% PbO, 10.5% $B_2O_3$, 1.8% ZnO, 0.6% BaO, 0.5% CaO, 5.2% CdO, 12.8% $SiO_2$) were dispersed in the vehicle, printed on soda lime glass substrates, dried and fired in air as follows: 350°C. for 10 minutes and plunged into a preheated muffle furnace at a peak temperature in the range 570°–600°C. for 10 minutes. Table I sets forth proportions of materials, peak firing temperature, and resistivity of the fired samples. Adhesion of each fired sample to the substrate was good as examined by scratching the fired films with a sharp point.

The fired film of Example 1 was found by X-ray analysis to comprise nickel metal (Norelco diffractometer, monochromatic copper K alpha radiation). The fired films of Examples 2–6 were observed to be magnetic, indicating the presence of nickel metal (no X-ray or magnetic observations were made on the films of Examples 7–10).

EXAMPLES 11–20 and Showing A

In contrast with Examples 1–10 wherein soda lime glass substrates were used (and hence low firing temperatures had to be employed due to the low softening point of such substrates), in Examples 11–20 an alumina substrate was used. Hence, higher firing temperatures could be employed. In Showing A, infinite resistivity was obtained at a $Ni_3B/Ni_3Si$ ratio higher than that of the present invention.

In Examples 11–18 $Ni_3B$/glass mixtures were used; in Examples 19–20 and Showing A mixtures of $Ni_3Si$, glass, and solid solutions of the formula $Ni_3B_{1-x}Si_x$ were employed. The glass in each example contained 65% PbO, 34% $SiO_2$, and 1% $Al_2O_3$. Useful conductors were produced in each example by firing in air.

TABLE I

| Example No. | $Ni_3B$ (g.) | Glass (g.) | Vehicle (g.) | Firing Temp. (°C.) | Resistivity (ohms/square) |
|---|---|---|---|---|---|
| 1 | 1.88 | 0.12 | 0.60 | 570 | 0.054 |
| 2 | 1.84 | 0.16 | 0.65 | 570 | 0.157 |
| 3 | 1.84 | 0.16 | " | 585 | 0.045 |
| 4 | 1.84 | 0.16 | " | 600 | 0.043 |

TABLE I-continued

| Example No. | $Ni_3B$ (g.) | Glass (g.) | Vehicle (g.) | Firing Temp. (°C.) | Resistivity (ohms/square) |
|---|---|---|---|---|---|
| 5 | 1.80 | 0.20 | " | 585 | 0.038 |
| 6 | 1.76 | 0.24 | " | 585 | 0.038 |
| 7 | 1.70 | 0.30 | " | 585 | 0.038 |
| 8 | 1.60 | 0.40 | " | 585 | 0.047 |
| 9 | 1.0 | 1.0 | " | 570 | 0.217 |
| 10 | 0.8 | 1.20 | " | 570 | 0.680 |

The compositions set forth in Table II were printed on the alumina substrates, dried, and fired at 350°C. for 10 minutes and then plunged into a muffle furnace at 850°C. and held there for at least 10 minutes, as specified in Table II. The resistivity of the resultant films is set forth in Table II. Nickel metal was found by X-ray diffraction to be in the fired films of Examples 11–14 (determinations were not made on the films of Examples 15–20). The adhesion of the films was examined by scratching the fired films with a sharp point and found to be excellent for Examples 11 and 12 and good for Examples 19 and 20; adhesion was not determined on the remaining examples. It was observed that the fired films of Examples 11–20 could be refired in air for longer periods of time (e.g., 20 minutes at 850°C.) without a significant change in sheet resistivity or oxidation of nickel metal to NiO as evidenced by X-ray diffraction patterns.

EXAMPLES 21, 22, and Showing B

Physical mixtures (not solid solutions) of $Ni_3B$ particles, $Ni_3Si$ particles, and glass particles were dispersed in a vehicle, printed on alumina substrates and fired in air using the glass and firing schedule of Example 11 (including 10 minutes at 850°C. peak). Compositions and resultant resistivities are set forth in Table III. Showing B employed an amount of $Ni_3Si$ in excess of that of the present invention and produced a useless device.

EXAMPLES 23 and 24

A $Ni_3B$/glass composition was fired in various non-oxidizing atmospheres at 850°C. on an alumina substrate to produce useful conductors. The composition contained 1.46 g. $Ni_3B$, 0.41 g. vehicle (14:1 terpineol to ethyl cellulose here, unlike other experiments), and 0.12 g. glass (38% $SiO_2$, 4% $TiO_2$, 18% BaO, 7% $Al_2O_3$, 8% ZnO, 5% MgO, 15% $B_2O_3$, 5% CaO). It was printed on 96% alumina and dried at 100°C. as above. The alumina chips bearing the dried print were each placed in a quartz tube, which was then evacuated.

In Example 23 the tube was flushed with a 3/1 (by volume) mixture of hydrogen and nitrogen and fired at 850°C. for 10 minutes in the gas mixtures by plunging into a preheated 850°C. oven. Fired film adhesion was excellent. The resistivity of the resultant film was excellent, 0.047 ohm/square.

In Example 24 the tube was flushed with pure nitrogen and fired as in Example 23. The adhesion was excellent. The resistivity was 0.048 ohms/square.

X-ray diffraction of the fired films of both Examples 23 and 24 showed the presence of $Ni_3B$ and a trace of nickel metal.

The fired film of Example 24 was refired (850°C., 10 minutes) in the atmosphere of Example 23 (3/1 by volume hydrogen/nitrogen) and yielded a resistivity of 0.038 ohm/square.

EXAMPLES 25–27

Dispersions of Ni metal powder and $Ni_3B$ powder (plus the glass of Example 1) were printed and fired on soda lime glass substrates as in Example 1. Resistivities were excellent (see Table IV).

EXAMPLE 28

Compositions of the present invention were used to

TABLE II

| Example No. | $Ni_3B$ (g.) | $Ni_3B/Ni_3Si$ (g.) | $Ni_3B/Ni_3Si$ (Molar Ratio $Ni_3B/Ni_3Si$) | Glass (g.) | Vehicle (g.) | Time at 850°C. (min.) | Resistivity (ohms/sq.) |
|---|---|---|---|---|---|---|---|
| 11 | 1.96 | — | — | 0.04 | 0.60 | 10 | 0.016 |
| 12 | " | — | — | " | " | 20 | 0.016 |
| 13 | " | — | — | " | " | 30 | nd* |
| 14 | " | — | — | " | " | 45 | nd |
| 15 | 1.92 | — | — | 0.08 | " | 10 | 0.016 |
| 16 | 1.86 | — | — | 0.12 | " | " | 0.018 |
| 17 | 1.84 | — | — | 0.16 | " | " | 0.017 |
| 18 | 1.20 | — | — | 0.80 | 0.65 | " | 0.150 |
| 19 | — | 1.80 | 1/1 | 0.20 | 0.60 | " | 0.182 |
| 20 | — | 1.80 | 3/1 | 0.20 | " | " | 0.055 |
| Showing A | — | 1.80 | 1/3 | 0.20 | " | " | ∞ |

*"nd" means not determined.

TABLE III

| Example No. | $Ni_3B$ (g.) | $Ni_3Si$ (g.) | Molar Ratio $Ni_3B/Ni_3Si$ | Glass (g.) | Vehicle (g.) | Resistivity (ohms/sq.) |
|---|---|---|---|---|---|---|
| 21 | 0.7 | 0.7 | 1/0.9 | 0.1 | 0.5 | 0.068 |
| 22 | 0.48 | 0.92 | 1/1.8 | 0.1 | 0.5 | 0.635 |
| (Showing B) | 0.35 | 1.05 | 1/2.5 | 0.1 | 0.5 | ∞ |

TABLE IV

| Example No. | $Ni_3B$ (g.) | Ni (g.) | Glass (g.) | Vehicle (g.) | Resistivity (ohm/sq.) |
|---|---|---|---|---|---|
| 25 | 0.28 | 1.12 | 0.16 | 0.44 | 0.125 |

TABLE IV-continued

| Example No. | Ni₂B (g.) | Ni (g.) | Glass (g.) | Vehicle (g.) | Resistivity (ohm/sq.) |
|---|---|---|---|---|---|
| 26 | 0.42 | 0.98 | 0.16 | 0.44 | 0.050 |
| 27 | 0.56 | 0.84 | 0.16 | 0.44 | 0.063 | make end terminations for resistors. A glass rod about 2 mm in diameter and 7 mm long was coated with tin oxide. Each end of the rod was dipped into a dilute dispersion of Ni₂B and glass particles (9 parts Ni₂B and 1 part of the glass of Example 1) and fired in air at 550°C. for 10 minutes to produce a resistor having nickel-based terminations.

EXAMPLE 29

A simple gas discharge display device was prepared on a soda lime glass substrate using a composition of the present invention to form some electrodes. On a soda lime glass substrate there was printed a 20-mil wide electrode, in the desired configuration, using a dispersion of 74 parts Ni₂B powder, 6 parts of glass powder of Example 1, and 20 parts vehicle. The print was dried, and fired at 350°C. for 10 minutes and at 575°C. for 10 minutes, each in a preheated oven. Between this substrate and another glass substrate bearing Pd/Ag electrodes was clamped an alumina spacer. The cavity between the electroded substrates was evacuated, then filled with argon. voltage (held at about 260 V) was applied to excite the gas, causing it to glow. Complex display devices can be made in this manner.

I claim:

1. Conductor compositions of finely divided inorganic powder dispersed in a liquid vehicle, wherein the inorganic powder comprises one or more nickel compounds having an overall approximate composition of $$(Ni_2B)_a(Ni_2Si)_b$$

wherein the sum of $a$ plus $b$ is one, $a$ is in the range ⅓ to 1, and $b$ is in the range 0 to ⅔.

2. Compositions according to claim 1 wherein the nickel compound is Ni₂B.

3. Compositions according to claim 2 comprising a mixture of Ni₂B and Ni₂Si wherein there are up to 2 moles of Ni₂Si per mole of Ni₂B.

4. Compositions according to claim 1 wherein the nickel compound is a solid solution of the approximate formula $$Ni_2B_{1-x}Si_x$$

wherein $x$ is in the approximate range 0.01–0.1.

5. Compositions according to claim 4 of a mixture of Ni₂Si with said Ni₂B₁₋ₓSiₓ, wherein the total amount of Si present in said nickel compounds is no more than two times the amount of B present therein, on an atomic basis.

6. Compositions according to claim 1 additionally comprising finely divided glass powder as an inorganic binder.

7. Compositions according to claim 2 additionally comprising finely divided glass powder as an inorganic binder.

8. Compositions according to claim 3 additionally comprising finely divided glass powder as an inorganic binder.

9. Compositions according to claim 4 additionally comprising finely divided glass powder as an inorganic binder.

10. Compositions according to claim 5 additionally comprising finely divided glass powder as an inorganic binder.

11. Compositions according to claim 6 of 30–100% of said nickel compound(s), based on the total weight of inorganic powder.

12. Compositions according to claim 11 of 50–98% of said nickel compound(s).

13. Compositions according to claim 12 of 70–96% of said nickel compound(s).

14. Compositions according to claim 1 additionally comprising nickel metal powder.

15. Compositions according to claim 2 additionally comprising nickel metal powder.

16. Compositions according to claim 6 additionally comprising nickel metal powder.

17. Compositions according to claim 12 additionally comprising nickel metal powder.

* * * * *